United States Patent
Cheah et al.

(10) Patent No.: US 8,853,706 B2
(45) Date of Patent: Oct. 7, 2014

(54) HIGH VOLTAGE CASCODED III-NITRIDE RECTIFIER PACKAGE WITH STAMPED LEADFRAME

(75) Inventors: Chuan Cheah, Torrance, CA (US); Dae Keun Park, Irvine, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/364,189

(22) Filed: Feb. 1, 2012

(65) Prior Publication Data

US 2012/0280245 A1 Nov. 8, 2012

Related U.S. Application Data

(60) Provisional application No. 61/482,314, filed on May 4, 2011.

(51) Int. Cl.

| | |
|---|---|
| *H01L 21/60* | (2006.01) |
| *H03K 17/567* | (2006.01) |
| *H01L 23/00* | (2006.01) |
| *H03K 17/74* | (2006.01) |
| *H01L 23/495* | (2006.01) |
| *H03K 17/687* | (2006.01) |
| *H01L 25/18* | (2006.01) |

(52) U.S. Cl.
CPC ............. *H03K 17/74* (2013.01); *H03K 17/567* (2013.01); *H01L 24/01* (2013.01); *H03K 2017/6875* (2013.01); *H01L 25/18* (2013.01); *H01L 23/49575* (2013.01); *H01L 23/49562* (2013.01); *H03K 17/687* (2013.01)
USPC ............. 257/76; 257/140; 257/195; 257/696; 438/123

(58) Field of Classification Search
CPC .................... H01L 23/4334; H01L 23/49503; H01L 23/49524; H01L 23/49562; H01L 23/49575; H01L 24/01
See application file for complete search history.

(56) References Cited

U.S. PATENT DOCUMENTS

| | | | |
|---|---|---|---|
| 7,271,470 B1 * | 9/2007 | Otremba | 257/666 |
| 7,663,212 B2 | 2/2010 | Otremba | |
| 7,825,435 B2 | 11/2010 | Machida | |
| 2003/0155644 A1 | 8/2003 | Hirao | |

(Continued)

FOREIGN PATENT DOCUMENTS

| | | |
|---|---|---|
| JP | H 6-2687 | 1/1994 |
| JP | H 11-97570 | 4/1999 |

(Continued)

*Primary Examiner* — Minh-Loan T Tran
*Assistant Examiner* — Fazli Erdem
(74) *Attorney, Agent, or Firm* — Farjami & Farjami LLP

(57) ABSTRACT

Some exemplary embodiments of high voltage cascoded III-nitride semiconductor package with a stamped leadframe have been disclosed. One exemplary embodiment comprises a III-nitride transistor having an anode of a diode stacked atop a source of the III-nitride transistor, and a stamped leadframe comprising a first bent lead coupled to a gate of the III-nitride transistor and the anode of the diode, and a second bent lead coupled to a drain of the III-nitride transistor. The bent leads expose respective flat portions that are surface mountable. In this manner, reduced package footprint, improved surge current capability, and higher performance may be achieved compared to conventional wire bonded packages. Furthermore, since multiple packages may be assembled at a time, high integration and cost savings may be achieved compared to conventional methods requiring individual package processing and externally sourced parts.

20 Claims, 5 Drawing Sheets

(56) References Cited

U.S. PATENT DOCUMENTS

| | | |
|---|---|---|
| 2005/0285249 A1 | 12/2005 | Carney |
| 2007/0063216 A1 | 3/2007 | Hu |
| 2007/0176291 A1* | 8/2007 | Cheah et al. .................. 257/744 |
| 2007/0222044 A1 | 9/2007 | Otremba |
| 2008/0191216 A1* | 8/2008 | Machida et al. ................ 257/76 |
| 2009/0189291 A1* | 7/2009 | Landau et al. ................ 257/777 |
| 2010/0000772 A1* | 1/2010 | Letterman et al. ............ 174/260 |
| 2011/0024884 A1 | 2/2011 | Xue |
| 2011/0101511 A1* | 5/2011 | Lu et al. ........................ 257/669 |
| 2011/0133337 A1* | 6/2011 | Shau ............................. 257/738 |
| 2012/0223322 A1 | 9/2012 | Lin |
| 2012/0228696 A1* | 9/2012 | Carpenter et al. ............ 257/329 |
| 2012/0280245 A1 | 11/2012 | Cheah |
| 2012/0280246 A1 | 11/2012 | Cheah |

FOREIGN PATENT DOCUMENTS

| | | |
|---|---|---|
| JP | 2000-223815 | 8/2000 |
| JP | 2003-197859 | 7/2003 |
| JP | 2007-27404 | 2/2007 |
| JP | 2008-198735 | 8/2008 |

\* cited by examiner

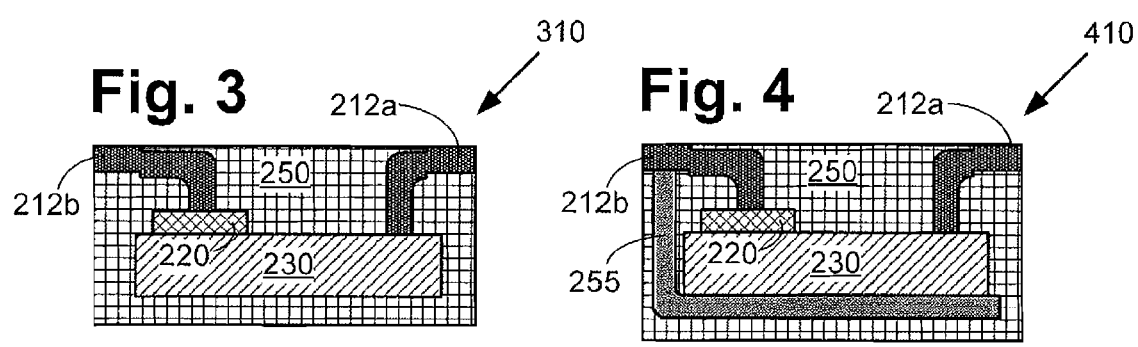

US 8,853,706 B2

HIGH VOLTAGE CASCODED III-NITRIDE RECTIFIER PACKAGE WITH STAMPED LEADFRAME

The present application claims the benefit of and priority to a provisional application entitled "High Voltage Cascoded GaN Rectifier Leadless Packages," Ser. No. 61/482,314 filed on May 4, 2011. The disclosure in that provisional application is hereby incorporated fully by reference into the present application.

BACKGROUND OF THE INVENTION

1. Field of the Invention

The present invention relates generally to semiconductor devices. More particularly, the present invention relates to packaging of semiconductor devices.

2. Background Art

For high power and high performance circuit applications, III-nitride transistors such as gallium nitride (GaN) field effect transistors (FETs) are often desirable for their high efficiency and high voltage operation. In particular, it is often desirable to combine such III-nitride transistors with other devices, such as silicon diodes, to create high performance rectifiers such as cascoded rectifiers.

Unfortunately, conventional package integration techniques for combining III-nitride transistors with silicon diodes often negate the benefits provided by such III-nitride transistors. For example, conventional package designs may require wire bonds to leads for terminal connections, undesirably increasing package form factor, manufacturing costs, parasitic inductance, resistance, and thermal dissipation requirements of the package. While it is known to use conductive clips instead of wire bonds to provide a high performance package terminal suitable for high voltage applications, the requirement to separately form and place the conductive clips precludes the possibility of processing multiple packages in a single pass, which is highly desirable for streamlining assembly, increasing integration, and reducing fabrication costs.

Thus, a unique and cost-effective solution is needed to support the efficient fabrication of packages integrating high voltage cascoded III-nitride rectifiers.

SUMMARY OF THE INVENTION

A high voltage cascoded III-nitride rectifier package with a stamped leadframe, substantially as shown in and/or described in connection with at least one of the figures, and as set forth more completely in the claims.

BRIEF DESCRIPTION OF THE DRAWINGS

FIG. 3 illustrates a cross sectional view of a high voltage cascoded III-nitride rectifier package, according to an embodiment of the invention.
FIG. 4 illustrates a cross sectional view of a high voltage cascoded III-nitride rectifier package, according to another embodiment of the invention.

DETAILED DESCRIPTION OF THE INVENTION

Figure 1:
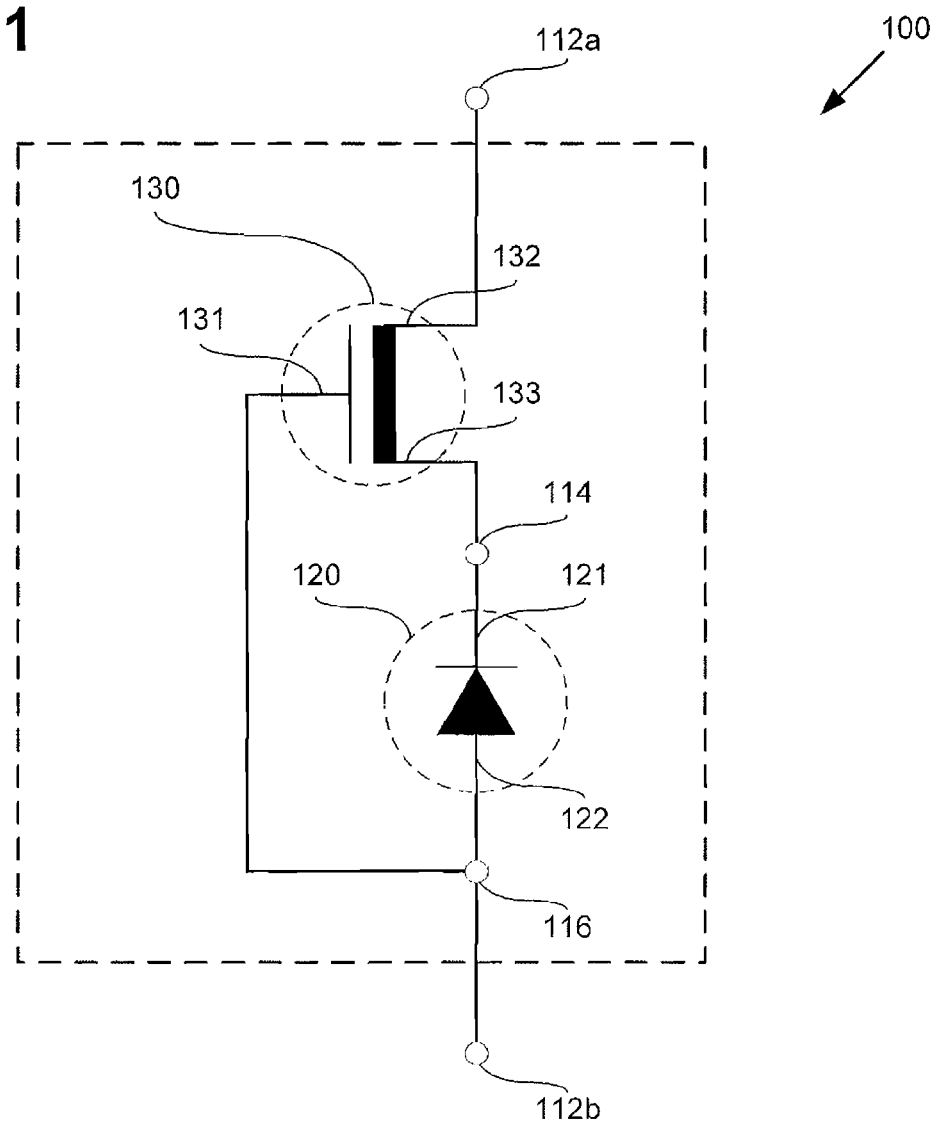
FIG. 1 illustrates a circuit diagram of a III-nitride transistor coupled with a Group IV diode.

The present application is directed to a high voltage cascoded III-nitride rectifier package with a stamped leadframe. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

As used herein, the phrase "III-Nitride or III-N" refers to a compound semiconductor that includes nitrogen and at least one group three element including Al, Ga, In and B, and including but not limited to any of its alloys, such as aluminum gallium nitride ($Al_xGa(1-x)N$), indium gallium nitride ($In_yGa(1-y)N$), aluminum indium gallium nitride ($Al_xIn_yGa(1-x-y)N$), gallium arsenide phosphide nitride ($GaAsPb\,N(1-a-b)$), aluminum indium gallium arsenide phosphide nitride ($Al_xIn_yGa(1-x-y)AsAPb\,N(1-a-b)$), amongst others. III-nitride material also refers generally to any polarity including but not limited to Ga-polar, N-polar, semi-polar or non-polar crystal orientations. The III-Nitride material also includes either the Wurtzitic, Zincblende or mixed polytypes, and includes single-crystal, monocrystal, polycrystal or amorphous crystal structures.

Also as used herein, the phrase "Group IV" refers to a semiconductor that includes at least one group four element including Si, Ge and C, and also includes compound semiconductors SiGe and SiC amongst others. Group IV also refers to semiconductor material which consists of layers of Group IV elements or doping of group IV elements to produce strained silicon or strained Group IV material, and also includes Group IV based composite substrates including SOI, SIMOX and SOS (silicon on sapphire), amongst others.

U.S. patent application titled "III-Nitride Transistor Stacked with Diode in a Package," Ser. No. 13/053,646 filed on Mar. 22, 2011, whose disclosure is hereby incorporated fully by reference into the present application, teaches a two-terminal stacked-die package including a diode, such as a silicon diode, stacked atop a III-nitride transistor, such that a cathode of the diode resides on and is electrically coupled to a source of the III-nitride transistor. A first terminal of the package is coupled to a drain of the III-nitride transistor, and a second terminal of the package is coupled to an anode of the diode.

The present application addresses and discloses modifications needed to form a two-terminal stacked-die package for use in high voltage (200V-1200V or higher) applications. In particular, the present application addresses and discloses the construction of such a package by describing the use of a stamped leadframe providing bent leads for surface mounting.

The present application describes the physical arrangement of a stacked-die wire-bondless surface mountable high voltage package. In particular, a Group IV diode is stacked atop a III-N material transistor in a quad flat no-lead (QFN) package. Modifications required to accommodate the high voltage field differential between the anode and cathode of the device (>200V) include widening the physical separation between the anode and cathode to, for example, 2.7500 mm or greater.

FIG. 1 illustrates a circuit diagram of a III-nitride transistor coupled with a Group IV diode, such as a silicon diode. In the present application, references to a "silicon diode" are made for brevity and convenience only. However, the "Group IV or silicon diode" in the context of the present invention's stacked-die package can be replaced with a non-silicon diode or in general with any diode. FIG. 1 includes terminals 112a and 112b, nodes 114 and 116, diode 120, and III-nitride transistor 130. III-nitride transistor 130 may, for example, comprise a gallium nitride (GaN) field effect transistor (FET), or a GaN high electron mobility transistor (HEMT), and may more specifically comprise a depletion-mode GaN transistor. Diode 120 can be either a PN junction diode or a Schottky diode.

In the example shown in FIG. 1, the cathode 121 of diode 120 is coupled to the source 133 of III-nitride transistor 130 at node 114. Additionally, a complete cascoded switch is formed by coupling the gate 131 of III-nitride transistor 130 to the anode 122 of diode 120 at node 116. Thus, the circuit of FIG. 1 implements a high performance cascoded rectifier. However, in alternative embodiments, the circuit may comprise a different configuration of diode 120 with III-nitride transistor 130.

It may be preferable to form the III-Nitride FET or III-Nitride HEMT as discussed in U.S. Pat. No. 7,745,849 issued on Jun. 29, 2010 titled "Enhancement Mode III-Nitride Semiconductor Device with Reduced Electric Field Between the Gate and the Drain," U.S. Pat. No. 7,759,699 issued on Jul. 20, 2010 titled "III-Nitride Enhancement Mode Devices," U.S. Pat. No. 7,382,001 issued on Jun. 3, 2008 titled "Enhancement Mode III-Nitride FET," U.S. Pat. No. 7,112,830 issued on Sep. 26, 2006 titled "Super Lattice Modification of Overlying Transistor," U.S. Pat. No. 7,456,442 issued on Nov. 25, 2008 titled "Super Lattice Modification of Overlying Transistor," U.S. Pat. No. 7,339,205 issued on Mar. 4, 2008 titled "Gallium Nitride Materials and Methods Associated with the Same," U.S. Pat. No. 6,849,882 issued on Feb. 1, 2005 titled "Group-III Nitride Based High Electron Mobility Transistor (HEMT) with Barrier/Spacer Layer," U.S. Pat. No. 6,617,060 issued on Sep. 9, 2003 titled "Gallium Nitride Materials and Methods," U.S. Pat. No. 6,649,287 issued on Nov. 18, 2003 titled "Gallium Nitride Materials and Methods," U.S. Pat. No. 5,192,987 issued on Mar. 9, 1993 titled "High Electron Mobility Transistor with GAN/ALXGA1-XN Heterojunctions," and U.S. patent application titled "Group III-V Semiconductor Device with Strain-Relieving Interlayers," Ser. No. 12/587,964 filed on Oct. 14, 2009, U.S. patent application titled "Stress Modulated Group III-V Semiconductor Device and Related Method," Ser. No. 12/928,946 filed on Dec. 21, 2010, U.S. patent application titled "Process for Manufacture of Super Lattice Using Alternating High and Low Temperature Layers to Block Parasitic Current Path," Ser. No. 11/531,508 filed on Sep. 13, 2006, U.S. patent application titled "Programmable III-Nitride Transistor with Aluminum-Doped Gate," Ser. No. 13/021,437 filed on Feb. 4, 2011, U.S. patent application titled "Enhancement Mode III-Nitride Transistors with Single Gate Dielectric Structure," Ser. No. 13/017,970 filed on Jan. 31, 2011, U.S. patent application titled "Gated AlGaN/GaN Heterojunction Schottky Device," Ser. No. 12/653,097 filed on Dec. 7, 2009, U.S. patent application titled "Enhancement Mode III-Nitride Device with Floating Gate and Process for Its Manufacture," Ser. No. 12/195,801 filed on Aug. 21, 2008, U.S. patent application titled "III-Nitride Semiconductor Device with Reduced Electric Field Between Gate and Drain and Process for Its Manufacture," Ser. No. 12/211,120 filed on Sep. 16, 2008, U.S. patent application titled "III-Nitride Power Semiconductor Device Having a Programmable Gate," Ser. No. 11/857,113 filed on Sep. 8, 2007, U.S. provisional patent application titled "III-Nitride Heterojunction Devices, HEMTs and Related Device Structures," Ser. No. 61/447,479 filed on Feb. 28, 2011, and U.S. provisional patent application titled "III-Nitride Material Interlayer Structures," Ser. No. 61/449,046 filed on Mar. 3, 2011, which are all hereby incorporated fully into the present application by reference. It may also be desirable that the III-Nitride FET be a high voltage III-N FET. III-N FET 130 may be optimized to operate with a $V_{drain}$ of between 200V-5000V, or it may be preferred that FET 130 be optimized to operate between 500V-700V or any other sub range between 200V-5000V.

Figure 2A:
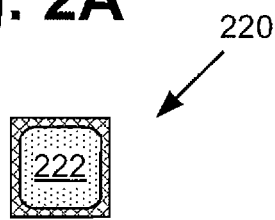
FIG. 2A illustrates a front side of a group IV diode.
Figure 2B:
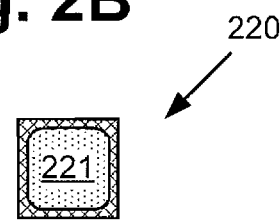
FIG. 2B illustrates a backside of a group IV diode.
Figure 2C:
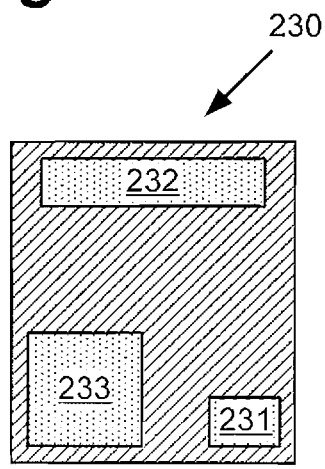
FIG. 2C illustrates a front side of a III-nitride transistor.
Figure 2D:
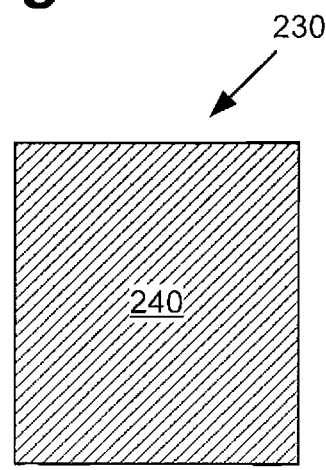
FIG. 2D illustrates a backside of a III-nitride transistor.

Turning to FIGS. 2A-2D, FIG. 2A illustrates a front side of a group IV diode, FIG. 2B illustrates a backside of a group IV diode, FIG. 2C illustrates a front side of a III-nitride transistor, and FIG. 2D illustrates a backside of a III-nitride transistor. With respect to FIGS. 2A-2D, diode 220 may correspond to diode 120 from FIG. 1, and III-nitride transistor 230 may correspond to III-nitride transistor 130 from FIG. 1. In certain embodiments, a die size of approximately 1 mm×1 mm may be preferred for diode 220. In certain other embodiments, the die size of diode 220 may be larger or smaller. As shown in FIGS. 2A and 2B, the silicon diode 220 includes an anode 222 on a top surface and a cathode 212 on an opposite bottom surface. As shown in FIGS. 2C and 2D, the III-nitride transistor 230 includes a gate 231, a drain 232, and a source 233 on a top surface, whereas a bottom or backside surface is inactive. In certain embodiments, a die size of approximately 3.2 mm×2.795 mm may be preferred for III-nitride transistor 230. In certain other embodiments, the die size of III-nitride transistor 230 may be larger or smaller.

Next, FIGS. 2E, 2G, 2I, and 2L illustrate top views of a high voltage cascoded III-nitride rectifier package assembly, according to an embodiment of the invention. FIGS. 2F, 2H, 2J, 2K, and 2N also illustrate corresponding cross sectional views of a high voltage cascoded III-nitride rectifier package assembly, according to an embodiment of the invention. FIG. 2M also illustrates a bottom view of a completed high voltage cascoded III-nitride rectifier package assembly, according to an embodiment of the invention.

Figure 2E:
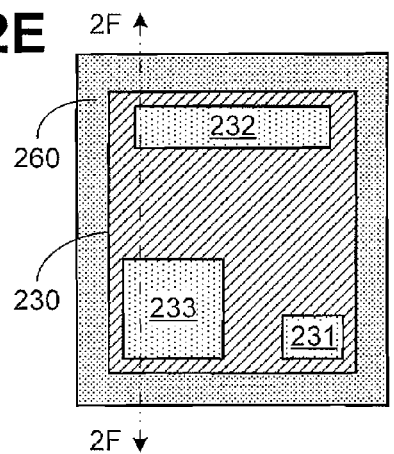
FIG. 2E illustrates a top view of a high voltage cascoded III-nitride rectifier package assembly, according to an embodiment of the invention.
Figure 2F:
FIG. 2F illustrates a cross sectional view of a high voltage cascoded III-nitride rectifier package assembly, according to an embodiment of the invention.

Starting with FIG. 2E, the III-nitride transistor 230 of FIGS. 2C-2D is placed on assembly fixture 260. Assembly fixture 260 may comprise a die tape or another fixture capable of securing multiple dies in place, for example in a strip or grid. In this manner, multiple packages may be assembled and processed at once. However, for simplicity, the Figures may only illustrate the assembly of a single package. As shown in FIG. 2E, the backside 240 of III-nitride transistor 230 is coupled to assembly fixture 260 such that gate 231, drain 232, and source 233 are accessible on a top surface. FIG. 2F also illustrates a cross sectional view corresponding to line 2F-2F in FIG. 2E.

Figure 2G:
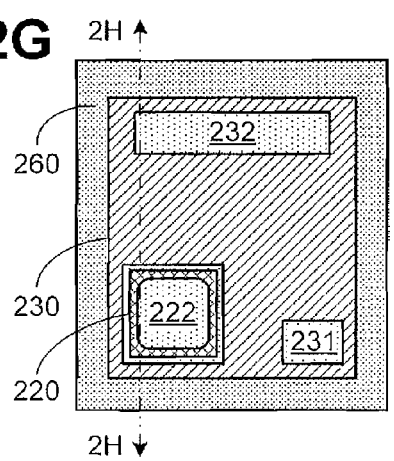
FIG. 2G illustrates a top view of a high voltage cascoded III-nitride rectifier package assembly, according to an embodiment of the invention.
Figure 2H:
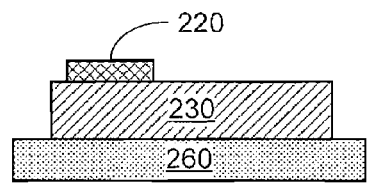
FIG. 2H illustrates a cross sectional view of a high voltage cascoded III-nitride rectifier package assembly, according to an embodiment of the invention.

From FIG. 2E to FIG. 2G, diode 220 is stacked atop III-nitride transistor 230 such that the cathode 221 (not visible) resides on source 233. As a result, the anode 222 is accessible on a top surface of diode 220. Prior to such stacking, solder, such as a solder paste or a solder pre-form, may be applied to gate 231, drain 232, and source 233. Alternatively, other materials such as conductive adhesive or conductive tape may substitute for solder. FIG. 2H also illustrates a cross sectional view corresponding to line 2H-2H in FIG. 2G.

Figure 2I:
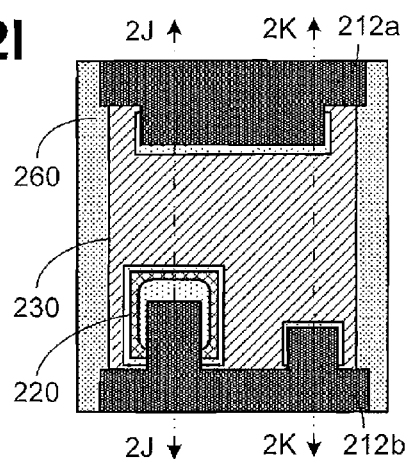
FIG. 2I illustrates a top view of a high voltage cascoded III-nitride rectifier package assembly, according to an embodiment of the invention.
Figure 2J:
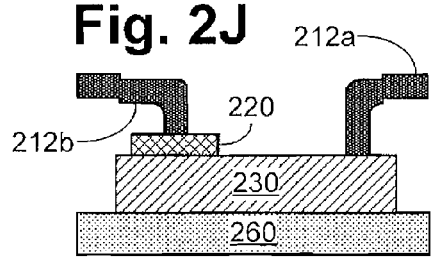
FIG. 2J illustrates a cross sectional view of a high voltage cascoded III-nitride rectifier package assembly, according to an embodiment of the invention.
Figure 2K:
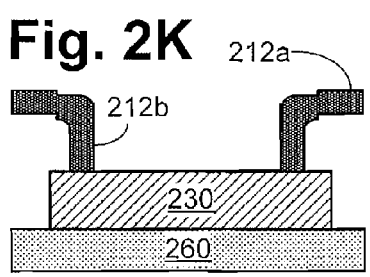
FIG. 2K illustrates a cross sectional view of a high voltage cascoded III-nitride rectifier package assembly, according to an embodiment of the invention.

From FIG. 2G to FIG. 2I, a stamped leadframe including bent lead 212a and bent lead 212b is utilized, for example by weighting on top of the assembly fixture. Prior to such weighting, additional solder may be deposited on top of anode 222 of diode 220. As shown in FIGS. 2J and 2K, the leadframe may be stamped such that bent leads 212b and 212b are provided, wherein each bent lead also has a respective flat portion on a top surface thereof, suitable for surface mounting. The stamped leadframe may comprise, for example, a copper or copper alloy leadframe, and may have a thickness of approximately 250 microns.

More specifically, as shown in FIG. 2I, a first bent lead or bent lead 212b is weighed on top of anode 222 of diode 220 and on top of gate 231 of III-nitride transistor 230, as illustrated by the cross sectional views of FIGS. 2J and 2K corresponding to line 2J-2J and 2K-2K in FIG. 2I, respectively. Additionally, a second bent lead or bent lead 212a is weighed on top of drain 232 of III-nitride transistor 230, as shown in FIG. 2I and further illustrated by the cross sectional views of FIGS. 2J and 2K. Although FIG. 2I illustrates bent leads 212a and 212b as independent portions, it should be understood that the bent leads may be joined as part of a larger leadframe so that multiple packages may be processed concurrently and later separated after completion. Moreover, while leadframe 212b is shown to connect to anode 222 of diode 220 using a straight connection in FIG. 2J, alternative embodiments may use various alternative connections to provide greater mechanical stability or mating surface area, as described below in conjunction with FIG. 2O.

While weighting the leadframe, the entire assembly may be heated, for example in a reflow or conveyor oven, to reflow the previously deposited solder. As a result, cathode 221 of diode 220 may be electrically and mechanically coupled to source 233 of III-nitride transistor 230, bent lead 212b may be connected to gate 231 of III-nitride transistor 230 and anode 222 of diode 220, and bent lead 212a may be connected to drain 232 of III-nitride transistor 230. Thus, the cascoded rectifier circuit illustrated in diagram 100 of FIG. 1 is provided, with bent lead 212a corresponding to terminal 112a of FIG. 1 and bent lead 212b corresponding to terminal 112b of FIG. 1.

From FIG. 2I to FIG. 2L, a mold compound 250 may be applied to encapsulate package 210, resulting in bent lead 212a and bent lead 212b exposing respective flat portions on the top surface of package 210. The flat portions of bent lead 212a and 212b shown in FIG. 2L may be substantially coplanar to facilitate surface mounting of package 210. Mold compound 250 may comprise, for example, a plastic epoxy molding compound, which may be applied using a Air-Cavity design or a Plastic-Molded design, amongst others. Each of the flat portions may expose a surface area of at least 3.0000 mm by 0.5000 mm. A distance of at least 2.7500 mm may be provided between the flat portions, for example a distance of 3.0000 mm, enabling high voltage operation at 600V while maintaining a compact package footprint no greater than 3.5000 mm by 4.0000 mm. As shown by the bottom view of FIG. 2M, the mold compound 250 may be applied such that the backside 240 of III-nitride transistor 230 is exposed through mold compound 250. However, in alternative embodiments, backside 240 may also be encapsulated within mold compound 250, as discussed below in conjunction with FIGS. 3 and 4.

Package 210 may then be singulated and assembly fixture 260 may be removed, using conventional methods as known in the art. Thus, package 210 is ready to be flipped for surface mounting to a support surface, such as a printed circuit board or substrate, via the first and second flat portions exposed respectively by bent leads 212b and 212a.

Figure 2L:
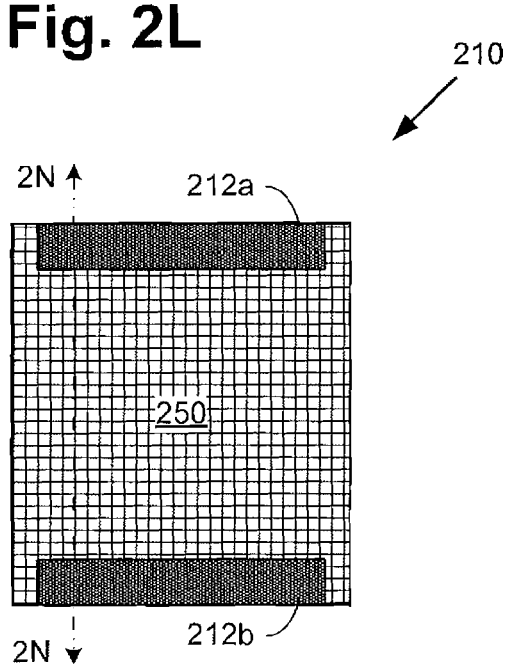
FIG. 2L illustrates a top view of a high voltage cascoded III-nitride rectifier package assembly, according to an embodiment of the invention.
Figure 2M:
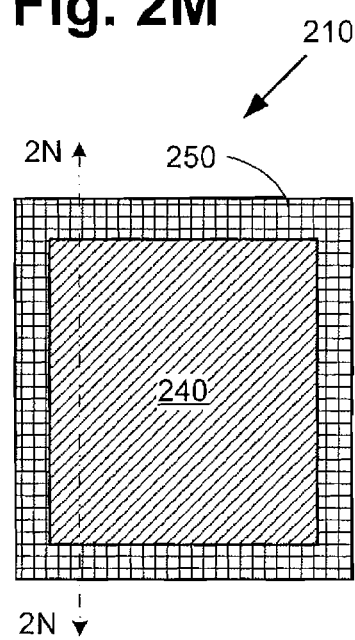
FIG. 2M illustrates a bottom view of a high voltage cascoded III-nitride rectifier package assembly, according to an embodiment of the invention.
Figure 2N:
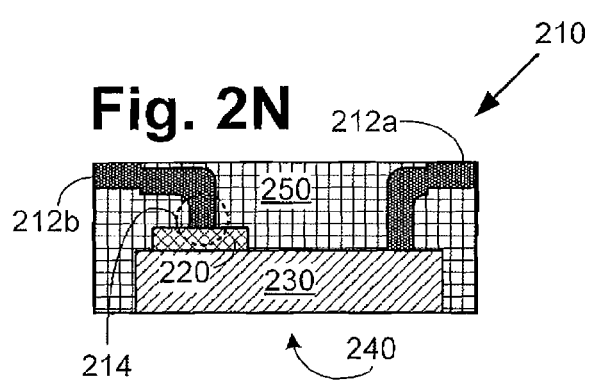
FIG. 2N illustrates a cross sectional view of a high voltage cascoded III-nitride rectifier package assembly, according to an embodiment of the invention.

FIG. 2N illustrates a cross sectional view corresponding to line 2N-2N in FIGS. 2L and 2M. Comparing FIG. 2N to FIG. 2J, it may be observed that mold compound 250 is added while exposing the backside 240 of III-nitride transistor 230, and that assembly fixture 260 is removed from package 210. Thus, all the components of package 210, including III-nitride transistor 230, diode 220, and bent leads 212a and 212b may be encapsulated by mold compound 250. A compact package height of 1.5500 mm may also be provided. Optionally, a heatsink may also be affixed to backside 240 for improved thermal dissipation.

Figure 2O:
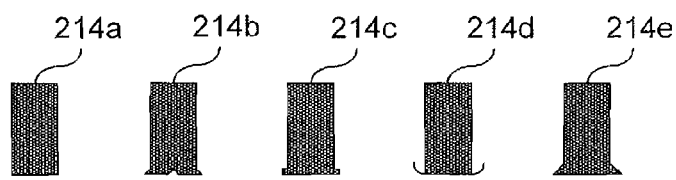
FIG. 2O illustrates cross sectional views of leadframe mating surfaces for coupling to the group IV diode, according to an embodiment of the invention.

FIG. 2O illustrates cross sectional views of lead mating surfaces for connecting to the group IV diode, according to an embodiment of the invention. As previously discussed and as shown in FIG. 2N, the connection 214 of bent lead 212b to anode 222 of diode 220 may comprise various different connectors other than a straight connector. Thus, connector 214 may be selected from the group consisting of a straight connector 214a, a screw-head 214b, a nail-head 214c, a mushroom connector 214d, or a coin connector 214e, as illustrated in FIG. 2O. An appropriate connector may be selected based on application requirements for mating surface area, mechanical stability, and ease of manufacture.

While the above examples have focused on an assembly process starting from III-nitride transistor 230 and ending with the stamped leadframe, alternative assembly processes may also be utilized. For example, an assembly in a reverse order may begin by stamping the leadframe in the same pattern with bent leads 212a and 212b, dispensing solder on the leadframe, placing the diode 220 on bent lead 212b, dispensing solder on cathode 221 of diode 220, flipping III-nitride transistor 230 onto the assembly, reflowing the solder to make the cascoded rectifier connections as in FIG. 1, applying the mold compound 250, and singulating the package, resulting in the same package 210 but using a different assembly order.

Turning to FIG. 3, FIG. 3 illustrates a cross sectional view of a high voltage cascoded III-nitride rectifier package, according to another embodiment of the invention. Comparing package 310 of FIG. 3 with package 210 of FIG. 2N, it can be observed that mold compound 250 is overmolded around III-nitride transistor 230, thereby encapsulating and protecting backside 240 of III-nitride transistor 230.

Turning to FIG. 4, FIG. 4 illustrates a cross sectional view of a high voltage cascoded III-nitride rectifier package, according to another embodiment of the invention. Comparing package 410 of FIG. 4 with package 310 of FIG. 3, it can be observed that a thermal clip 255 is coupled to the backside 240 of III-nitride transistor 230 and is also connected to bent lead 212b. In alternative embodiments, thermal clip 255 may be connected to bent lead 212a instead of bent lead 212b. Thermal clip 255 may comprise any highly conductive material, for example copper, and may be attached using solder or another material prior to the application of mold compound 250. Thus, improved thermal dissipation may be provided for III-nitride transistor 230 while still encapsulating and protecting III-nitride transistor 230 with the surrounding mold compound 250. As shown in FIG. 4, the optional addition of thermal clip 255 may require a slightly larger package footprint, such as 4.3000 mm wide by 1.9000 mm tall.

Thus, a high voltage cascoded III-nitride rectifier package with a stamped leadframe and methods for fabricating such a package have been described. The disclosed package provides a high voltage III-nitride cascoded rectifier in a compact package using a leadless design. As a result, reduced package footprint, improved surge current capability, and higher performance may be achieved compared to conventional wire bonded packages. Furthermore, since multiple packages may be assembled at a time, high integration and cost savings may be achieved compared to conventional methods requiring individual package processing and externally sourced parts.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A wire-bondless surface mountable high voltage semiconductor package comprising:
    a III-nitride transistor having a gate, a source, and a drain;
    a diode having an anode and a cathode, said diode stacked atop said III-nitride transistor such that said cathode resides on said source and is mechanically and electrically coupled to said source;
    a stamped leadframe comprising:
        a first bent lead residing on and connected to said gate of said III-nitride transistor and said anode of said diode;
        a second bent lead connected to said drain of said III-nitride transistor;
    said first bent lead and second bent lead each having respective flat portions for surface mounting said high voltage semiconductor package.

2. The high voltage semiconductor package of claim 1, wherein said respective flat portions are substantially coplanar.

3. The high voltage semiconductor package of claim 1, further comprising a mold compound encapsulating said high voltage semiconductor package including said III-nitride transistor, said diode, said first bent lead and said second bent lead.

4. The high voltage semiconductor package of claim 1, further comprising a mold compound encapsulating said high voltage semiconductor package while exposing a backside of said III-nitride transistor.

5. The high voltage semiconductor package of claim 1, further comprising a thermal clip connected to a backside of said III-nitride transistor and to said first bent lead.

6. The high voltage semiconductor package of claim 1, further comprising a thermal clip connected to a backside of said III-nitride transistor and to said second bent lead.

7. The high voltage semiconductor package of claim 1, wherein said first bent lead is connected to said anode by a connector selected from the group consisting of a coin connector, a mushroom connector, a nail-head, a screw-head, and a straight connector.

8. The high voltage semiconductor package of claim 1, wherein said stamped leadframe is a copper leadframe.

9. The high voltage semiconductor package of claim 1, wherein said diode is a Schottky diode.

10. The high voltage semiconductor package of claim 1, wherein said III-nitride transistor is a GaN FET.

11. The high voltage semiconductor package of claim 1, wherein said III-nitride transistor is a GaN HEMT.

12. A method for manufacturing a wire-bondless surface mountable high voltage semiconductor package, said method comprising:
    placing into an assembly fixture a III-nitride transistor having a gate, a source, and a drain;
    stacking atop said source of said III-nitride transistor a diode having a cathode and an anode, said cathode residing on said source;
    utilizing a stamped leadframe and stacking atop and connecting a first bent lead to said gate of said III-nitride transistor and said anode of said diode, and connecting a second bent lead to said drain of said III-nitride transistor;
    said first bent lead and second bent lead each having respective flat portions for surface mounting said high voltage semiconductor package.

13. The method of claim 12, wherein said respective flat portions are substantially coplanar.

14. The method of claim 12, further comprising encapsulating said high voltage semiconductor package with a mold compound, said encapsulating including said III-nitride transistor, said diode, said first bent lead and said second bent lead.

15. The method of claim 12, further comprising encapsulating said high voltage semiconductor package with a mold compound, said encapsulating exposing a backside of said III-nitride transistor.

16. The method of claim 12, further comprising connecting a thermal clip to a backside of said III-nitride transistor and to said first bent lead.

17. The method of claim 12, further comprising connecting a thermal clip to a backside of said III-nitride transistor and to said second bent lead.

18. The method of claim 12, wherein said connecting said first bent lead to said anode of said diode is by a connector selected from the group consisting of a coin connector, a mushroom connector, a nail-head, a screw-head, and a straight connector.

19. The method of claim 12, wherein said diode is a Schottky diode.

20. The method of claim 12, wherein said III-nitride transistor is a GaN FET.

* * * * *